(12) United States Patent
Kadono et al.

(10) Patent No.: US 7,538,015 B2
(45) Date of Patent: May 26, 2009

(54) METHOD OF MANUFACTURING MICRO STRUCTURE, AND METHOD OF MANUFACTURING MOLD MATERIAL

(75) Inventors: Koji Kadono, Tokyo (JP); Yosuke Murakami, Kanagawa (JP)

(73) Assignee: Sony Corporation, Tokyo (JP)

(*) Notice: Subject to any disclaimer, the term of this patent is extended or adjusted under 35 U.S.C. 154(b) by 574 days.

(21) Appl. No.: 10/540,637

(22) PCT Filed: Nov. 25, 2003

(86) PCT No.: PCT/JP03/14978

§ 371 (c)(1),
(2), (4) Date: Dec. 23, 2005

(87) PCT Pub. No.: WO2004/058629

PCT Pub. Date: Jul. 15, 2004

(65) Prior Publication Data

US 2006/0148370 A1 Jul. 6, 2006

(30) Foreign Application Priority Data

Dec. 24, 2002 (JP) ............................. 2002-372277

(51) Int. Cl.
*H01L 21/00* (2006.01)
*B82B 1/00* (2006.01)
*B82B 3/00* (2006.01)
*H01J 9/02* (2006.01)
*C01B 31/02* (2006.01)

(52) U.S. Cl. .................... 438/497; 438/503; 438/20; 977/842; 977/876; 977/893; 445/50

(58) Field of Classification Search ............... 977/873, 977/874, 875, 876, 893, 842; 438/20, 497, 438/503; 445/50
See application file for complete search history.

(56) References Cited

U.S. PATENT DOCUMENTS 5,322,196 A * 6/1994 Burton ................ 222/109

(Continued)

FOREIGN PATENT DOCUMENTS

| JP | 05-205615 A | 8/1993 |
| JP | 11-194134 | 7/1999 |
| JP | 2000-86216 A | 3/2000 |
| JP | 2001-143601 A | 5/2001 |
| JP | 2003-146632 A | 5/2003 |
| WO | WO00/19494 A1 | 4/2000 |

OTHER PUBLICATIONS

Matsui, S. et al., "Three-dimensional nanostructure fabrication by focused-ion-beam chemical vapor deposition," J. Vac. Sci. Technol. B, vol. 18, No. 6, 2000, pp. 3181-3184.
Matsui, S. et al., "Three-dimensional nanostructure fabrication by focused-ion-beam chemical vapor deposition," J. Vac. Sci. Technol. B, vol. 18, No. 6, 2000, pp. 3181-3184, Nov./Dec. 2000.

*Primary Examiner*—M. Wilczewski
(74) *Attorney, Agent, or Firm*—Wolf, Greenfield & Sacks, P.C.

(57) ABSTRACT

Disclosed herein are a method of producing microstructure and a method of producing mold, the methods permitting production of much smaller pores than before in an atmosphere where impurities are negligible and also permitting production of microstructures having a smaller size and a higher crystallinity than before with the help of the pores. The method of producing microstructure comprises a step of making pores (4) in a substrate (1) to become a mold (5) by irradiation with a focused energy beam (3) and a step of growing a microstructure (8) in the thus made pores (4). The method of producing a mold includes a step of making pores (4) by irradiating a substrate (1) to become a mold (5) with a focused energy beam (3).

7 Claims, 8 Drawing Sheets

U.S. PATENT DOCUMENTS

| | | | | |
|---|---|---|---|---|
| 6,146,227 | A  * | 11/2000 | Mancevski | 445/24 |
| 6,597,090 | B1 * | 7/2003 | Mancevski | 313/309 |
| 6,627,842 | B1 * | 9/2003 | Fonash et al. | 219/121.17 |
| 6,827,979 | B2 * | 12/2004 | Mirkin et al. | 427/256 |
| 7,002,820 | B2 * | 2/2006 | Chen et al. | 365/34 |
| 7,189,940 | B2 * | 3/2007 | Kumar et al. | 219/121.43 |
| 7,419,887 | B1 * | 9/2008 | Quick et al. | 438/479 |

* cited by examiner

METHOD OF MANUFACTURING MICRO STRUCTURE, AND METHOD OF MANUFACTURING MOLD MATERIAL

TECHNICAL FIELD

The present invention relates to a method of producing microstructure and a method of producing mold.

BACKGROUND ART

Because microfabrication by top-down approach is physically limited (by the wavelength of laser beam), one-dimensional nanoscale microstructures are expected to play an important role for electronic devices. Intensive research and development works are going on in this field.

Among typical topics of such research are carbon nanotube (CNT) and metal nanowire. These materials, however, are hard to handle because of their small size. Their practical use will be feasible only after 2010 on account of problems with assembling and integration.

Active researches are going on for the method of their synthesis with a high degree of orientation. The resulting materials are expected to find use in field emission display and memory. There has been proposed a method of producing CNT by vapor phase growth in pores in zeolite or anodized alumina with pores functioning as a template. This method has been reported to be successful in synthesis of highly oriented CNT. (See Non-Patent Document 1.)

On the other hand, the method for grinding a material by using a focused ion beam (FIB), which is intended to thin a sample or skive a surface, is mainly used to prepare samples for observation under an electron microscope. (See Patent Document 1.) FIB has the advantage of being capable of performing sputtering on any material and grinding selectively a very small region (depending on the beams's spot size), without surface oxidation which is encountered in chemical methods.

A new method has been disclosed which consists of depositing three-dimensional microstructures by irradiation with FIB in a gaseous atmosphere. (See Patent Document 2.)

However, the use of FIB disclosed in the past is nothing more than energy irradiation.

Non-Patent Document 1: Uung Sang Suh, Applied Physics Letters 75, 2047 (1999) p. 2047, from line 32 in left column to line 15 in right column)

Patent Document 1: Japanese Patent Laid-open No. Hei 4-361132 (lines 24 to 49 in the second column; FIG. 1)

Patent Document 2: Japanese Patent Laid-open No. 2001-107252 (lines 32 to 45 in the fourth column; FIG. 1)

The related art technologies mentioned above, however, suffer the following disadvantages. Making pores in alumina by anodic oxidation (which is a chemical process) presents difficulties with controlling the pore diameter and avoiding the entrance of impurities during chemical reactions.

Moreover, CNT synthesized in pores made by anodic oxidation has a limited diameter that depends on the diameter of the pore as a template. The smallest diameter that can be achieved at the present time is about 80 nm, and a further reduction is required. Another disadvantage of this process is that the resulting CNT has a low degree of crystallinity in its wall structure and hence it does not exhibit ballistic conduction as a merit of CNT.

The present invention was completed to address the above-mentioned problems. It is an object of the present invention to provide a method of producing microstructure and a method of producing mold, the methods permitting production of much smaller pores than before in an atmosphere where impurities are negligible and also permitting production of microstructures having a smaller size and a higher crystallinity than before with the help of the pores.

DISCLOSURE OF INVENTION

The present invention is concerned with a method of producing microstructure which includes a step of making pores in a substrate to become a mold by irradiation with a focused energy beam and a step of growing a microstructure in the thus made pores. The present invention is concerned also with a method of producing a mold which includes a step of making pores by irradiating a substrate to become a mold with a focused energy beam.

According to the present invention, the step of making pores in a substrate to become a mold by irradiation with a focused energy beam is applicable to substrates of various materials unlike the conventional step of making pores by anodic oxidation. Moreover, it is simple to carry out because it does not need any chemical pretreatment.

In addition, the pores made by irradiation with a focused energy beam having a strong directivity are almost free of impurities originating from the electrolyte employed in the conventional chemical grinding.

The focused energy beam permits easy control over the diameter and length of the pore and microstructure if the apparatus is run under adequate conditions.

Also, owing to its high positional resolution, the focused energy beam permits pores to be made at specific positions. This means that pores in a desired array pattern can be made easily and the microstructures can be easily integrated in a high degree.

The method of the present invention yields microstructures which has a high degree of crystallinity in the wall structure on account of the steps of making pores in a substrate to become a mold by irradiation with a focused energy beam and growing a microstructure in the thus made pores.

Thus, the present invention concerning a method of producing microstructure and a method of producing mold is very useful for synthesis and assembling of high-quality nanoscale microstructure, and it will be applicable to electronic devices including field emission display and high-density memory.

BEST MODE FOR CARRYING OUT THE INVENTION

Figure 1A:
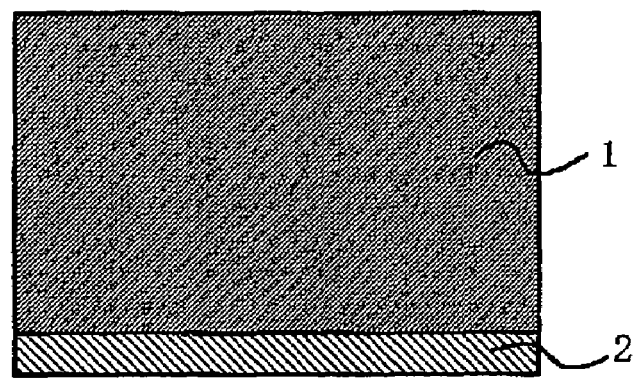
FIGS. 1A to 1F are schematic sectional views showing methods of producing microstructure according to one embodiment of the present invention.

The energy beam mentioned above that is used in the present invention should preferably be an ion beam, an electron beam, or a laser beam, with the first one being most desirable.

The ion beam is capable of making pores easily in the direction perpendicular to the substrate, with their diameter, depth, and intervals accurately controlled on the nanometer scale, if irradiation with the ion beam is carried out under adequate conditions for ion species, accelerating voltage, lens performance, spot size (corresponding to the diameter of the desired pore), irradiating position, etc.

The advantage of the ion beam as the energy beam to make pores physically is that it can be applied to substrates of various kinds unlike the conventional anodic oxidation which is limited in applicable materials. Another advantage is the absence of chemical pretreatment, which simplifies the process for making a mold.

Pores physically made by the ion beam are less contaminated with impurities than those made by chemical grinding with an electrolyte.

The ion beam can make pores at desired positions because the ion beam apparatus has a high positional resolution. This means that it can easily make an array of pores in a substrate and hence it can easily produce highly integrated microstructures.

The ion beam may be formed from any cations, which include metal ions such as $Ga^+$, $Si^+$, $Si^{++}$, $Be^+$, $Be^{++}$, $Au^+$, and $Au^{++}$ and gaseous ions such as $H^+$ and $He^+$.

Irradiation with the ion beam should be performed in such a way that the position of the beam is within an error of ±5 nm. The method according to the present invention permits pores to be made uniformly at intervals of 100 nm in any pattern of arrangement, in contrast to the conventional anodic oxidation which is incapable of making pores uniform in diameter.

The energy beam, particularly the ion beam, can make pores with a diameter smaller than 100 nm, or even smaller than 20 nm, and with a depth of several micrometers.

The method of the present invention is able to grow a microstructure in a gas phase, liquid phase or solid phase. The microstructure may be carbon nanotube or metal nanowire, which takes on a one-dimensional form.

Carbon nanotube as a one-dimensional microstructure may be obtained by making a pore, placing a catalyst at the bottom of the pore, and growing carbon nanotube from the catalyst. The second step may be accomplished by irradiating the previously made pore with a focused ion beam (or any other energy beam) in an atmosphere of gas as a raw material of the catalyst, so that the desired catalyst is precipitated at the bottom of the pore. The third step grows carbon nanotube as the one-dimensional microstructure from the catalyst.

The gas as a raw material of the catalyst may be a metal gas of iron, nickel, cobalt, tungsten, molybdenum, or gold. Preferred metal gases include $Fe(CO)_5$, $Ni(CO)_4$, $WF_6$, $W(CO)_6$, $Mo(CO)_6$, $Au(CH_3)_2$, and $Al(CH_3)_2$.

As mentioned above, the method according to the present invention consists of making pores and irradiating them with an energy beam (or focused ion beam) in an atmosphere of a gas that gives rise to a catalyst. In this way it is possible to efficiently and easily deposit the catalyst substance at the bottom of the pores (formed by the energy beam) without expanding the pore diameter.

The advantage of the above-mentioned method is that the carbon nanotube (as the microstructure grown from the catalyst) is free of impurities and has the wall structure with a high degree of crystallinity.

In what follows, an example of the method of the present invention will be described in more detail with reference to the accompanying drawings.

In the first step, a substrate 1 (such as an aluminum piece) is immobilize with a conductive paste 2, as shown in FIG. 1A.

Figure 1B:
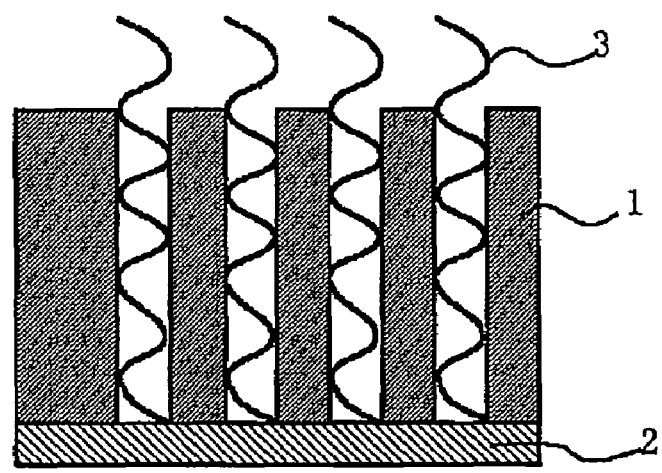
Figure 1C:
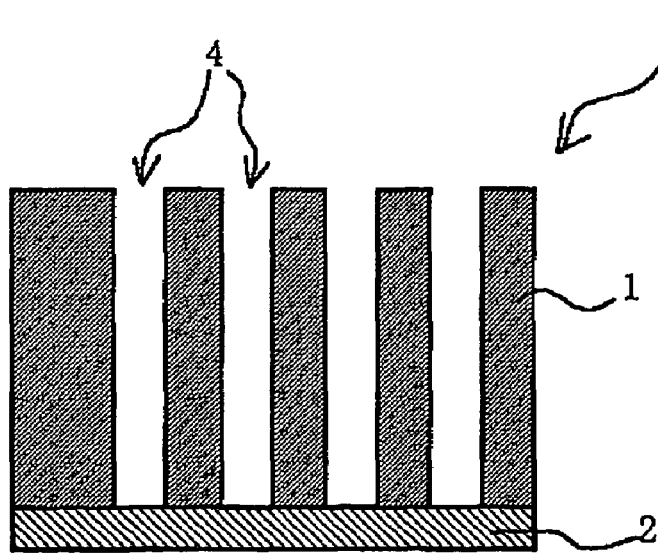

In the next step, the substrate 1 is irradiated with an energy beam 3 (such as $Ga^+$ beam), as shown in FIG. 1B. This irradiation makes pores 4 having the same diameter and depth at uniform intervals in a desired pattern of array. The aggregate of these pores function as a mold 5, as shown in FIG. 1C. Incidentally, the method according to the present invention can make pores densely.

The pores made by irradiation with an energy beam gave SEM micrographs as shown in FIG. 2, FIGS. 3A and 3B, and FIGS. 4A and 4B.

Figure 1D:
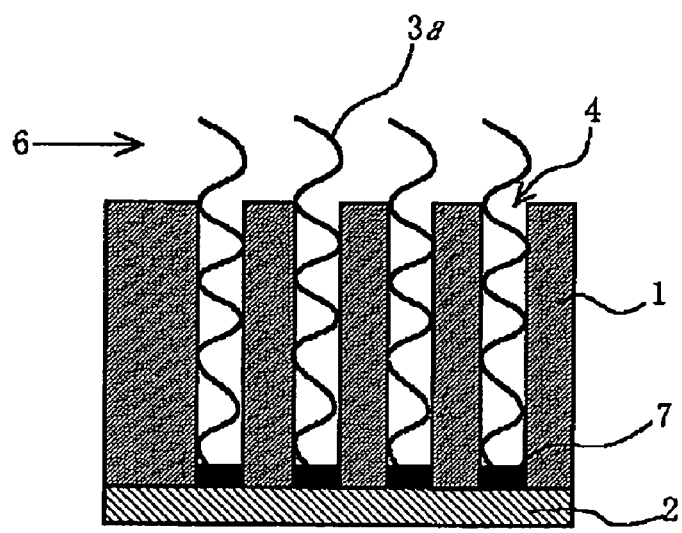
Figure 1E:
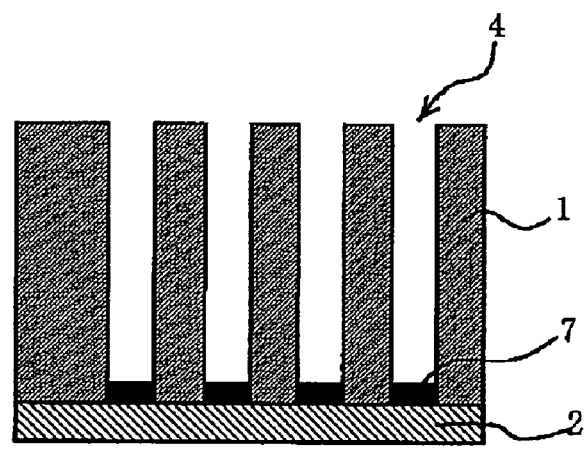

In the next step, the pores are irradiated with an energy beam 3a (such as ion beam) under a stream of $Ni(CO)_4$ gas as a raw material for the catalyst, as shown in FIG. 1D. This irradiation causes the catalyst substance 7 of fine nickel powder to deposit at the bottom of each pore 4, as shown in FIG. 1E.

The foregoing step permits the catalyst substance 7 to deposit easily and efficiently at the bottom of the pore 4 made by the ion beam 3 without expanding their diameter.

Figure 1F:
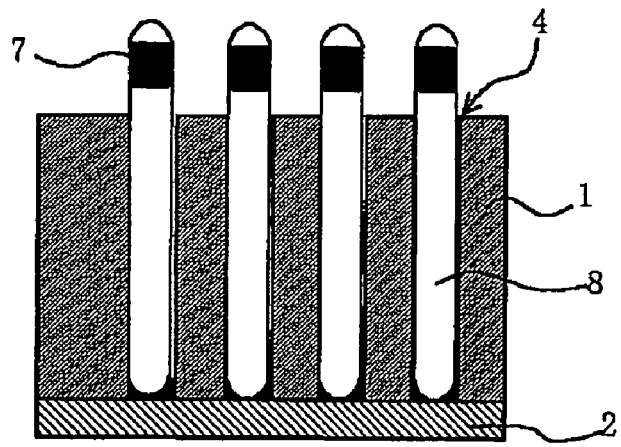
Figure 2:
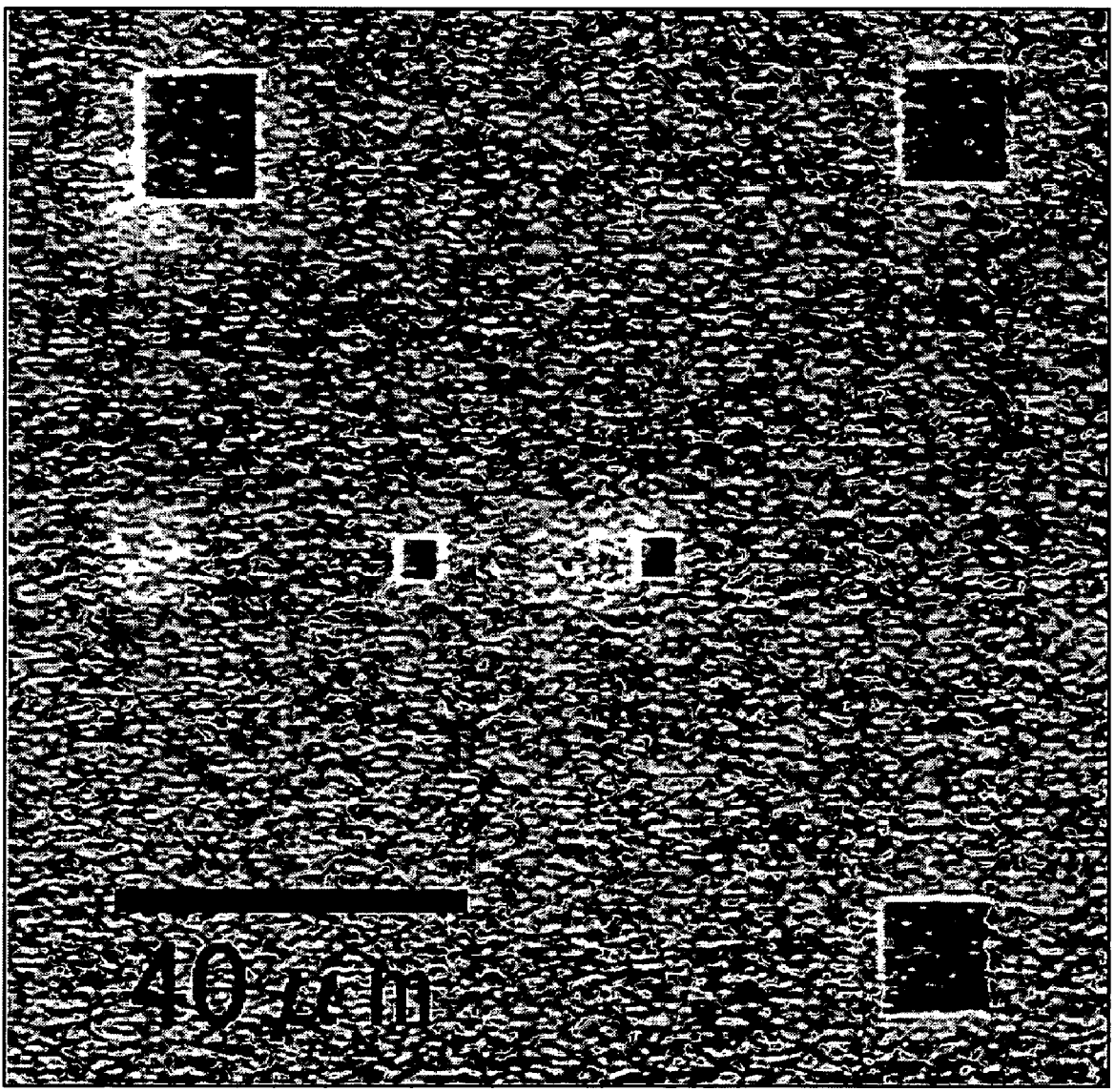
FIG. 2 is an SEM micrograph showing a mold prepared by the method of producing mold or microstructure.
Figure 3A:
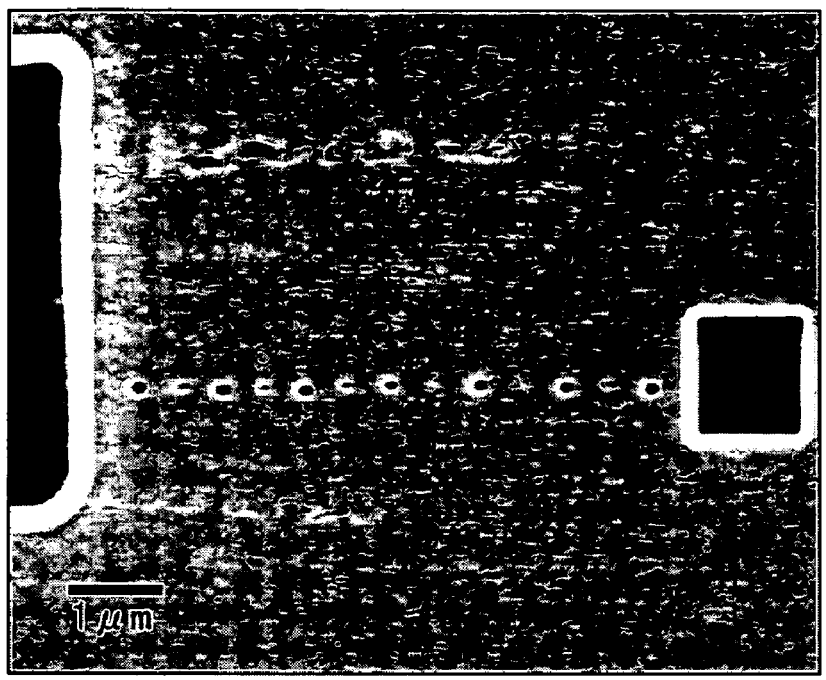
FIG. 3A is an SEM micrograph showing another mold (2 μm deep) prepared by the method of producing mold or microstructure.
Figure 3B:
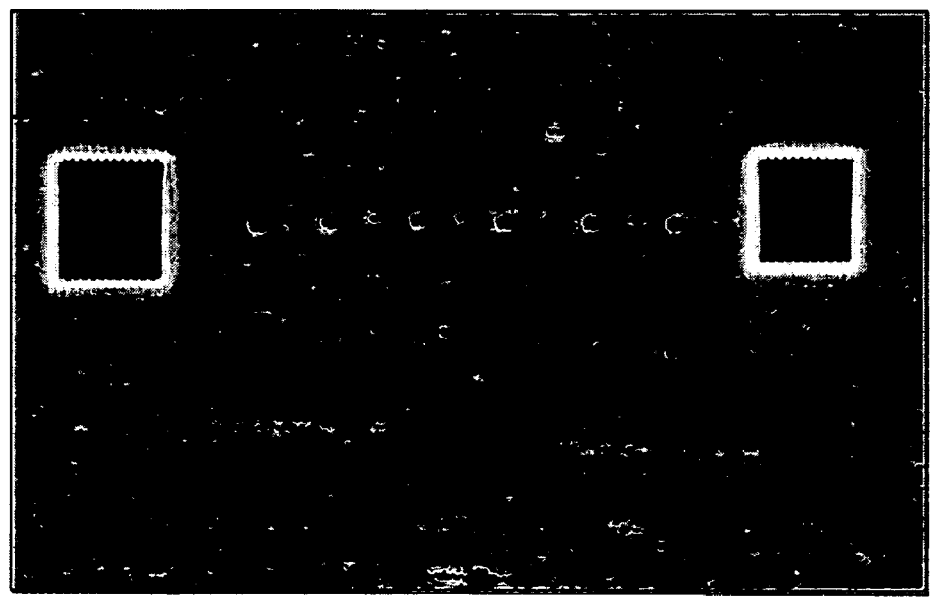
FIG. 3B is an SEM micrograph showing another mold (1 μm deep) prepared by the method of producing mold or microstructure.
Figure 4A:
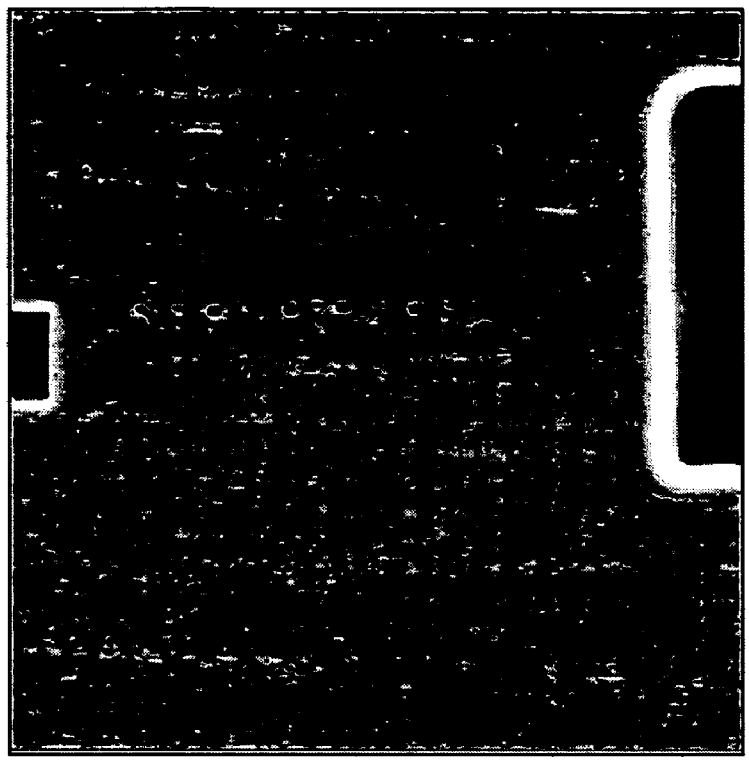
FIG. 4A is an SEM micrograph showing another mold (0.5 μm deep) prepared by the method of producing mold or microstructure.
Figure 4B:
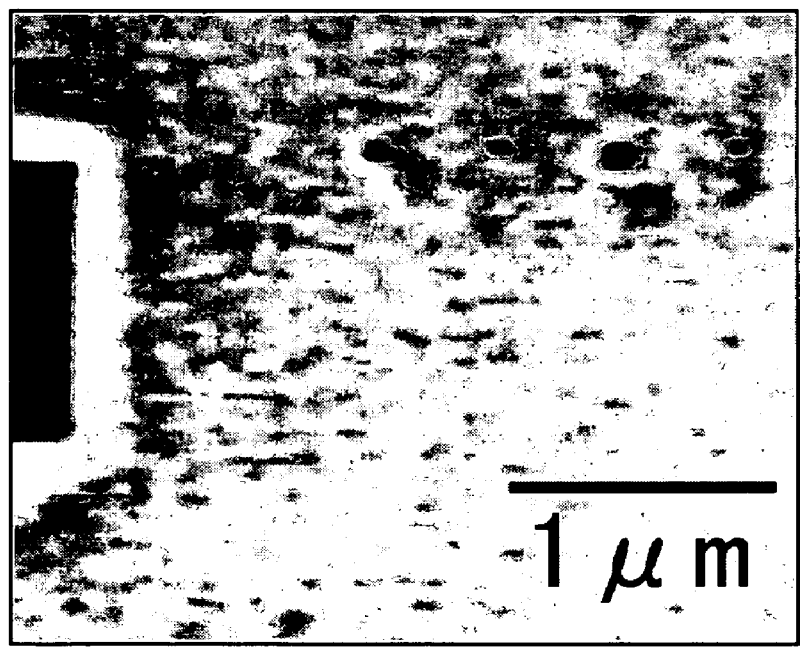
FIG. 4B is an SEM micrograph showing another mold (0.5 μm deep) prepared by the method of producing mold or microstructure.

In the next step, a microstructure 8 such as carbon nanotube is grown from the catalyst substance 7 of fine nickel powder in the pore 4, as shown in FIG. 1F. This step results in the pore 4 filled with a microstructure 8 such as carbon nanotube. The thus obtained carbon nanotube 8 has a structure which is determined by the shape of the pore 4. For example, the carbon nanotube may have a linear multiwalled structure which is highly oriented in the direction perpendicular to the substrate 1.

The method according to the present invention is based on a physical process that employs the ion beam 3. Therefore, it is applicable to the substrate 1 of any material and it does not need any chemical pretreatment. This simplifies the process for making the mold 5.

Another advantage of physical process resorting to the ion beam 3 is the impossibility of contamination with impurities arising from electrolyte, unlike the conventional chemical grinding. Thus, the resulting pores 4 are highly pure.

The foregoing steps permit easy control over the diameter and length of the pore 4 and the microstructure 8 if the apparatus for the ion beam 3 is run under adequate conditions.

Because of the high positional resolution possessed by the apparatus for the ion beam 3, the pores 4 can be made at specific positions in the substrate 1. The pores 4 may be arranged according to a desired pattern, and the microstructures 8 may be highly integrated.

The microstructures 8 grown in the pores 4 have the wall structure with a high degree of crystallinity.

The method of producing the microstructure 8 according to the present invention and the method of producing the mold 5 according to the present invention are very useful for synthesis and assembling of high-quality nanoscale microstructures 8. They are applicable to electronic devices including field emission display and high-density memory.

Figure 5:
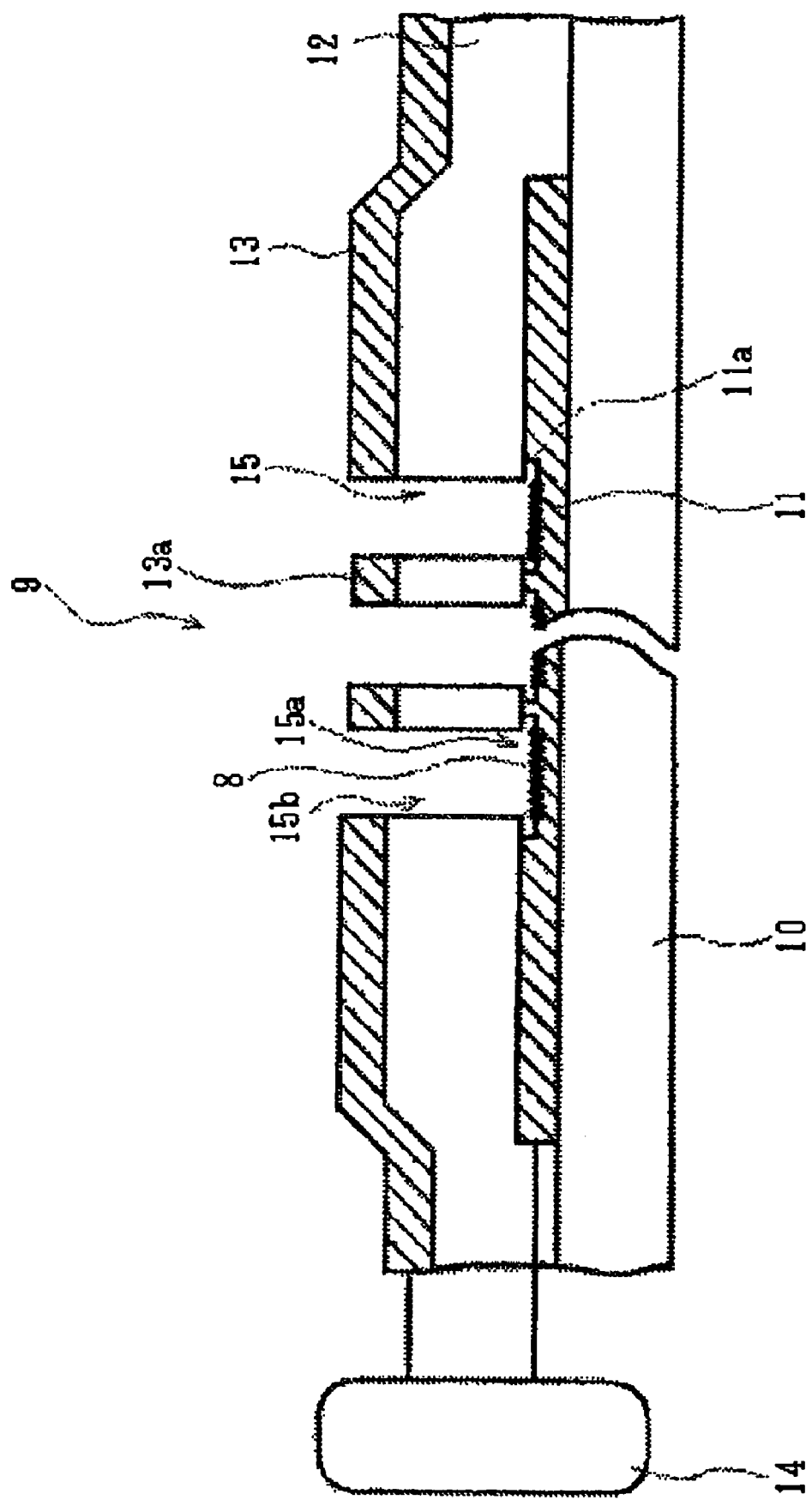
FIG. 5 is a schematic sectional view showing an electron emitting source constructed of the microstructure prepared by the method of producing microstructure.
Figure 6:
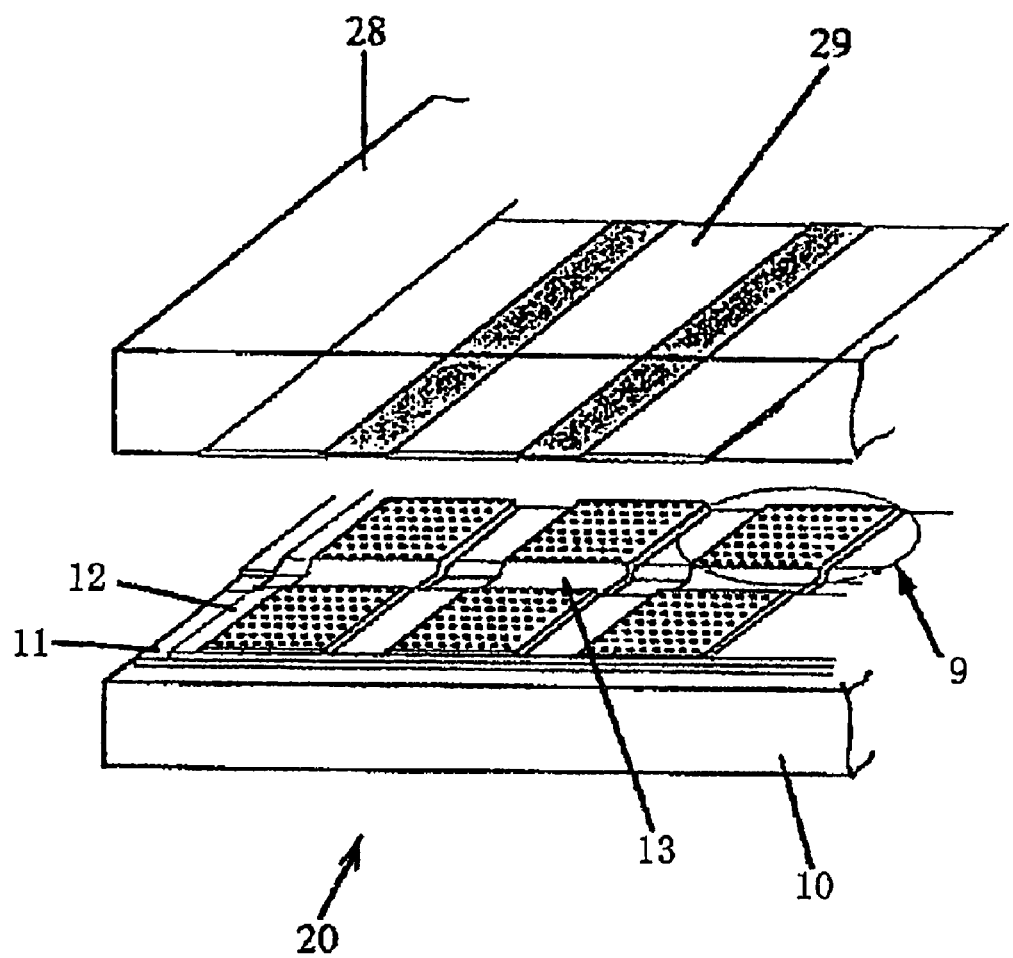
FIG. 6 is a schematic perspective view showing a display device provided with the electron emitting source constructed of microstructures.
Figure 7:
FIG. 7 is a schematic diagram showing the microstructure obtained by the method of producing microstructure.

FIGS. 5 and 6 are schematic diagrams showing a field emission display which employs the microstructure (such as carbon nanotube) as the electron emission source. The microstructure is used in the form remaining in the pore, as obtained in the above-mentioned steps.

As shown in FIG. 5, the electron emission source 9 is made up of the lower substrate 10 of glass or the like, the cathode lines 11 in strip form, the insulating layer 12, and the gate lines 13 in strip form (intersecting with the cathode lines 11), which are placed on top of the other. The cathode lines 11 and the gate lines 13 form the matrix structure. Each cathode line 11 and each gate line 13 are connected to the respective control means 14 for driving.

At the intersection of the cathode line 11 and the gate line 13 are formed a large number of pores 15 (having an approximately round cross section), which penetrate the gate line 13 and the insulating layer 12, reaching the middle of the thickness of the cathode line 11.

Above the bottom of the pore 15 is formed the microstructure 8 such as carbon nanotube, which has been produced earlier as shown in FIG. 1. The microstructure 8 may be left as such in the pore 4 when used for the electron emitting source 9. The substrate 10 on which the electron emitting source 9 is formed should preferably be made of a non-conductor such as alumina. The upper surface of the microstructure 8 is lower than the upper surface of the cathode line 11 by 100 nm (or it is closer to the substrate 10 than the upper surface of the cathode line 11 by 100 nm).

The pore 15 is made in such a way that its lowermost part 15a (below the upper surface of the cathode line 11) projects into the insulating layer 12 in the horizontal direction. The projecting part is indicated by 15b. The diameter including the projecting part 15b is larger than that of the pore 15 by 15%.

The electron emitting sources 9 arranged in large number constitute the display device as shown in FIG. 6. The display device has a lower substrate 10 and an upper substrate 28. On the lower substrate 10 are arranged a large number of electron emitting sources 9 constituting a display screen. The upper substrate 28 is a certain distance away from the anode on the lower substrate 10. On the upper substrate 28 are formed fluorescent stripes 29 parallel to the cathode line 11. The fluorescent stripes 29 face the electron emitting sources 9. The space between the fluorescent stripe 29 and the electron emitting source 9 is kept evacuated.

The display deice 20 works in the following manner. The control means 14 selects a specific cathode line 11 and a specific gate line 13 and applies a predetermined voltage across them. The applied voltage generates an electric field at the intersection of the cathode line 11 and the gate line 13. This electric field affects the microstructure 8 (or carbon nanotube) and the gate 13a within the pixel region, causing electrons to release themselves by tunnel effect from the microstructure 8 in the pore 15.

In other words, the control means 14 selects a cathode line 11 and a gate line 13 whose intersection coincides with an electron emitting source 9 under a pixel region constituting an image, and then the control means 14 applies a voltage cross them, so that the electron emitting source 9 is excited. Thus, the microstructure 8 in the pore 15 of the electron emitting source 9 emits electrons. The emitted electrons are accelerated by the voltage applied across the cathode line 11 and the upper substrate 28 as the anode. Eventually, the accelerated electrons impinge against the fluorescent material on the fluorescent plane 29, causing it to radiate visible light that forms an image.

The electron emitting source 9 constructed as mentioned above is equivalent to a cold cathode which consists of the microstructure 8 such as carbon nanotube formed in the pore 15 penetrating the gate line 13, the insulating layer 12, and part of the cathode line 11 in their thickness direction. This cold cathode works at a low voltage.

Moreover, since the sectional area of the pore 15a in the cathode line 11 is larger than the sectional area of the pore 15b in the gate line 13, the emitted electrons efficiently reach the anode without shorts between the gate line 13 and the cathode line 11.

The electron emitting source 9 is suitable for a large, very thin display device because of its simple structure.

The foregoing description is concerned with a display device in which the carbon nanotube as the microstructure grown in the pore is used as such (left in the pore) for the electron emitting source. The display device constructed in this way may be replaced by the one shown in FIG. 8. In this case, the carbon nanotube as the microstructure is grown in the pore and then removed from the pore. The second step may be accomplished by etching the mold in which the pores are made. The thus obtained carbon nanotube may be used as a p-type semiconductor after oxidation.

The method according to the present invention may also be modified as follows. The catalyst substance mentioned above is replaced by a magnetic metal, so that the resulting carbon nanotube as the microstructure contains the magnetic metal. This carbon nanotube may be used to construct a magnetic random access memory. Instead of replacing the catalyst substance with the magnetic metal, it is also possible to precipitate the magnetic metal in the completed carbon nanotube.

The advantage of the method of the present invention is that the energy beam (or ion beam) to make pores can be applied to a wide variety of substrates unlike the conventional anodic oxidation. Thus the substrate may be selected from any soft materials having a good thermal conductivity.

Irradiation with the energy beam or ion beam may be facilitated by using a mask such as a stencil mask.

It has been mentioned above that the catalyst substance is attached to the bottom of the pore by irradiating the pore with a focused energy beam (ion beam) in an atmosphere containing a gas from which the catalyst is derived. This procedure may be replaced by precipitating the catalyst substance electrochemically at the bottom of the completed pore.

The catalyst substance mentioned above is not particularly necessary in the case where the metal nanowire is grown as the microstructure.

The invention will be described in more detail with reference to the following examples.

EXAMPLE 1

An aluminum substrate measuring 5 mm square was cut out of an aluminum sheet of high purity (99.999%). After degreasing with acetone and cleaning with ethanol, the aluminum substrate was fixed with a conductive paste and allowed to stand in a vacuum (approximately $10^{-5}$ Pa) for 30 minutes.

The aluminum substrate was irradiated with a $Ga^+$ beam at an accelerating voltage of 30 kV and a beam current of 15 pA by using FB2000 (made by Hitachi). The beam was focused so that the beam diameter was 10 nm. It is to be noted that the Ga ion beam may be replaced by any other cation beam. The irradiating position of the ion beam was controlled within an error of ±5 nm by observing under an electron microscope. Irradiation with the ion beam was carried out to make pores, each measuring 10 nm in diameter and 2 μm in depth, at intervals of 20 nm, in the aluminum substrate. The rate of etching by irradiation was about 0.008 μm$^3$/s. The pore density was as high as $1.25 \times 10^{11}$ pores/cm$^2$. Incidentally, the pore density that can be achieved by anodic oxidation in an alumina substrate is about $1.1 \times 10^{10}$ pores/cm$^2$. See Uung Sang Suh, Applied Physics Letters 75 2047 (1999).

Irradiation with the ion beam was repeated for 10 seconds under the same conditions (accelerating position and irradiating position) as mentioned above, during which the apparatus was supplied with $Ni(CO)_4$ gas from which the catalyst is derived. The cross section of the substrate was observed under an electron microscope to confirm that nickel fine particles had precipitated at the bottom of each pore. The nickel fine particles were reduced by exposure to a mixed gas of $H_2$ (10%) and Ar (90%) at 500° C. for 1 hour.

Carbon nanotubes were grown by thermal decomposition method in an Ar carrier gas containing $C_2H_2$ (10%) and $H_2$ (20%).

Observation under a scanning electron microscope and a transmission electron microscope revealed that the resulting carbon nanotube has the structure which depends on the shape of the pore, that is, it is a linear multiwalled tube (10 nm in diameter) which is highly oriented in the direction perpendicular to the substrate.

The method used in this example to precipitate the catalyst particles directly by irradiation with an ion beam (or by FIB process) offers the advantage that the pore diameter is kept smaller than 10 nm unlike the conventional chemical method for precipitation. In other words, the FIB process permits the catalyst substance to deposit efficiently at the bottom of the pore without expanding the pore diameter.

EXAMPLE 2

An aluminum substrate measuring 5 mm square was cut out of an aluminum sheet of high purity (99.999%). After degreasing with acetone and cleaning with ethanol, the aluminum substrate was fixed with a conductive paste and allowed to stand in a vacuum (approximately $10^{-5}$ Pa) for 30 minutes.

The aluminum substrate was irradiated with a Ga$^+$ beam at an accelerating voltage of 30 kV and a beam current of 15 pA by using FB2000 (made by Hitachi). The beam was focused so that the beam diameter was 20 nm. It is to be noted that the Ga ion beam may be replaced by any other cation beam.

The irradiating position of the ion beam was controlled within an error of ±5 nm by observing under an electron microscope. Irradiation with the ion beam was carried out to make pores, each measuring 20 nm in diameter and 2 μm in depth, at intervals of 100 nm, in the aluminum substrate. The rate of etching by irradiation was about 0.008 μm$^3$/s. The pore density was as high as $1.25 \times 10^{11}$ pores/cm$^2$.

The aluminum substrate was immersed in a solution of $CoSO_4 \cdot 7H_2O$, and an AC voltage of 18 V was applied to the solution for 1 minute, so that cobalt fine particles (as the catalyst) were allowed to electrochemically precipitate at the bottom of the pores. The cobalt fine particles were reduced by exposure to a mixed gas of $H_2$ (10%) and Ar (90%) at 500° C. for 1 hour.

Carbon nanotubes were grown by thermal decomposition method in an Ar carrier gas containing $C_2H_2$ (10%) and $H_2$ (20%).

Observation under a scanning electron microscope and a transmission electron microscope revealed that the resulting carbon nanotube has the structure which depends on the shape of the pore, that is, it is a linear multiwalled tube (20 nm in diameter) which is highly oriented in the direction perpendicular to the substrate.

EXAMPLE 3

This example is intended to obtain the microstructure that would be applicable to the memory device.

First, an aluminum substrate measuring 5 mm square was cut out of an aluminum sheet of high purity (99.999%). After degreasing with acetone and cleaning with ethanol, the aluminum substrate was fixed with a conductive paste and allowed to stand in a vacuum (approximately $10^{-5}$ Pa) for 30 minutes.

Figure 8A:
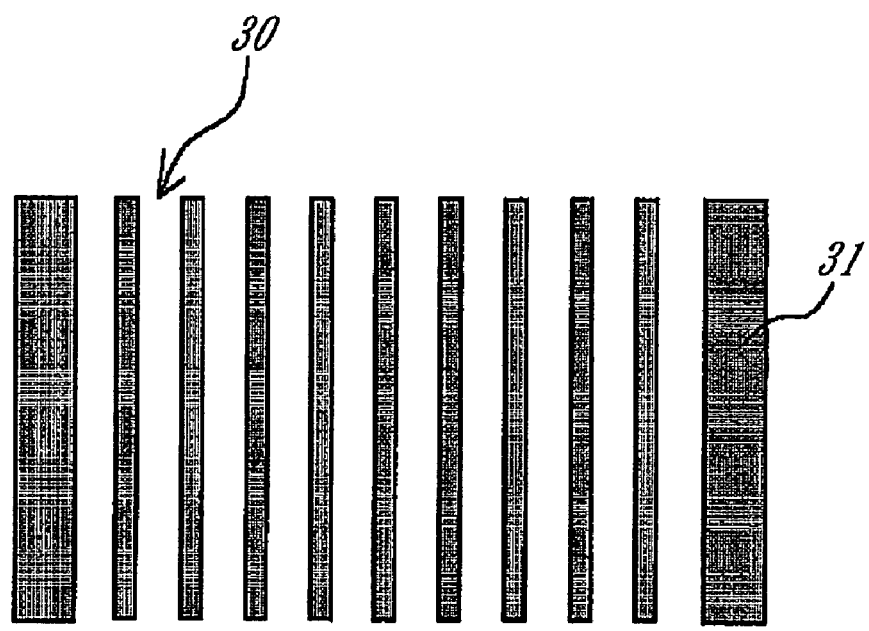
FIG. 8A is a partly cut-away schematic sectional view showing a memory element for the magnetic random access memory constructed of the microstructures obtained by the method of producing microstructure in one embodiment of the present invention.

Then, the aluminum substrate was irradiated with a Ga$^+$ beam at an accelerating voltage of 30 kV and a beam current of 15 pA by using FB2000 (made by Hitachi). The beam was focused so that the beam diameter was 10 nm. It is to be noted that the Ga ion beam may be replaced by any other cation beam. The irradiating position of the ion beam was controlled within an error of ±5 nm by observing under an electron microscope. Irradiation with the ion beam was carried out to make pores, each measuring 10 nm in diameter and 2 μm in depth, at intervals of 20 nm, in the aluminum substrate. The rate of etching by irradiation was about 0.008 μm$^3$/s. The pore density was as high as $1.25 \times 10^{11}$ pores/cm$^2$. FIG. 8A is a schematic sectional view showing the aluminum substrate having the thus made pores.

The aluminum substrate was immersed in a solution of $CoSO_4 \cdot 7H_2O$, and an AC voltage of 18 V was applied to the solution for 1 minute, so that cobalt fine particles (as the catalyst) were allowed to electrochemically precipitate at the bottom of the pores. The cobalt fine particles were reduced by exposure to a mixed gas of $H_2$ (10%) and Ar (90%) at 500° C. for 1 hour. Incidentally, the cobalt fine particles function not only as the catalyst for carbon nanotubes as the microstructure but also as the magnetic layer (pinned layer) of the magnetic memory element.

Carbon nanotubes were grown by thermal decomposition method in an Ar carrier gas containing $C_2H_2$ (10%) and $H_2$ (20%).

Excessively grown parts of carbon nanotubes were cut off, together with the substrate, by ultrasonic (40 kHz) treatment in acetone. In this way there were obtained carbon nanotubes with uniform lengths which are oriented in the axial direction.

The thus obtained carbon nanotubes together with the aluminum substrate were immersed in an acidic solution containing iron ions and hypochlorite as a reducing agent until the carbon nanotubes are filled with pure iron by electroless plating to such an extent that they assume a metallic color. As the result, individual carbon nanotubes possess the basic structure for the magnetic memory element of spin injection type.

The resulting microstructures are carbon nanotubes including a magnetic material, which are composed of a cobalt layer which is a hard magnetic material as the pinned layer, a hollow carbon nanotube as the spin transmitting layer, and an iron layer as the free layer.

The magnetic material-including carbon nanotubes were provided with carbon nanotubes (which are thinner than the carbon nanotubes) as electrodes and leading wire at their both ends, by using the atom manipulation method.

It was easy to make the carbon nanotubes to include the magnetic metal and to connect the wiring to the carbon nanotubes because the carbon nanotubes had open ends when they were formed in the pores in the aluminum substrate.

The magnetic material-including carbon nanotubes, together with the aluminum substrate, were placed on an insulating substrate of $SiO_2$, and the assembly was immersed in a 0.1 M solution of NaOH at 70° C. for 3 hours so that the aluminum substrate was decomposed and removed, with the magnetic material-including carbon nanotubes and the thinner carbon nanotubes as the electrode and wiring remaining in the form of bundle on the insulating substrate.

Figure 8B:
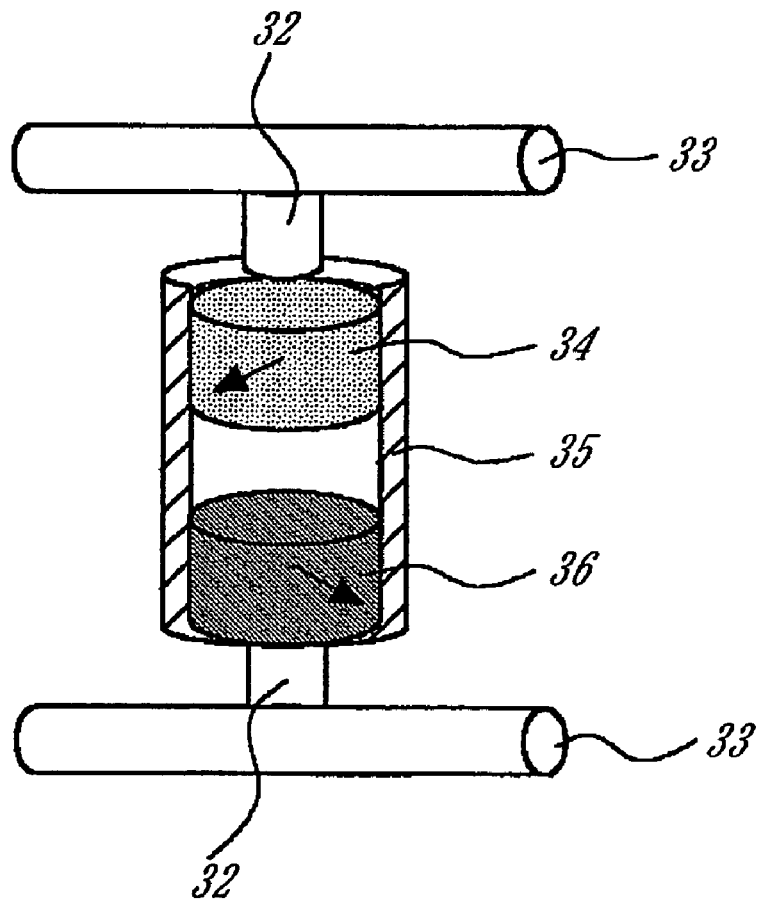
FIG. 8B is a schematic diagram showing a single memory cell.

The leading wiring was connected to signal wiring so as to form a pattern of two-dimensional addressable matrix. Finally, the insulating substrate was fixed onto a copper heat sink. In this way there was obtained a magnetic random access memory as shown in FIG. 8B.

The production method according to the present invention is designed to make pores in an aluminum substrate (which functions as a mold) by irradiation with a focused ion beam. The resulting pores have a low level of contamination. It permits easy control over the diameter and length of the pores and carbon nanotubes as the microstructure. It also permits easy production of pores in a desired array pattern in the aluminum substrate, which contributes to highly integrated carbon nanotubes.

It gives rise to the microstructure whose wall structure has a high degree of crystallinity because it consists of a step of irradiating the substrate (which functions as a mold) with a focused energy beam, thereby making pores, and a step of growing the microstructure in the pores.

Thus, the production method according to the present invention is very useful for synthesis and assembling of high-quality carbon nanotubes and is applicable to electronic devices such as high-density memory.

INDUSTRIAL APPLICABILITY

According to the present invention, the step of making pores in a substrate to become a mold by irradiation with a focused energy beam is applicable to substrates of various materials unlike the conventional step of making pores by anodic oxidation. Moreover, it is simple to carry out because it does not need any chemical pretreatment.

In addition, the pores made by irradiation with a focused energy beam are almost free of impurities originating from the electrolyte employed in the conventional chemical grinding.

The focused energy beam permits easy control over the diameter and length of the pore and microstructure if the apparatus is run under adequate conditions.

Also, owing to its high positional resolution, the focused energy beam permits pores to be made at specific positions. This means that pores in a desired array pattern can be made easily and the microstructures can be easily integrated in a high degree.

The method of the present invention yields microstructures which have a high degree of crystallinity in the wall structure on account of the steps of making pores in a substrate to become a mold by irradiation with a focused energy beam and growing the microstructure in the thus made pores.

Thus, the present invention concerning a method of producing microstructures and a method of producing molds is very useful for synthesis and assembling of high-quality nanoscale microstructures, and it will be applicable to electronic devices including field emission display and high-density memory.

The invention claimed is:

1. A method of producing micro structure which comprises a step of making pores in a substrate to become a mold by irradiation wit a focused energy beam and a step of growing a microstructure in the thus made pores;
    wherein said microstructure is grown from a catalyst substance which has been attached to the bottom of the previously made pores; and
    wherein said catalyst substance is precipitated at the bottom of the pores by irradiating the previously made pores with a focused energy beam in an atmosphere of a gas as a raw material of the catalyst.

2. The method of producing microstructure as defined in claim 1, wherein said energy beam is an ion beam, electron beam, or laser beam.

3. The method of producing microstructure as defined in claim 2, wherein said energy beam is one which is containing metal ions, such as Ga+, Si+, Si++, Be+, Be++, Au+, and Au++ or gaseous ions, such as H+ and He+.

4. The method of producing microstructure as defined in claim 1, wherein said pores have a diameter no larger than 100 nm.

5. The method of producing microstructure as defined in claim 2, wherein said ion beam is irradiated in such a way that the position of irradiation is within an error of ±5 nm.

6. The method of producing microstructure as defined in claim 5, wherein said pores are made at intervals of 100 nm and in any array pattern.

7. The method of producing microstructure as defined in claim 1, wherein said microstructure is grown in a gas phase, liquid phase, or solid phase.

* * * * *